US012469720B2

(12) United States Patent
Hanson et al.

(10) Patent No.: US 12,469,720 B2
(45) Date of Patent: Nov. 11, 2025

(54) ELECTROPLATING WETTING CHAMBER WITH REDUCED BUBBLE ENTRAPMENT

(71) Applicant: Applied Materials, Inc., Santa Clara, CA (US)

(72) Inventors: Kyle M. Hanson, Kalispell, MT (US); Eric J. Bergman, Kalispell, MT (US); Gregory J. Wilson, Kalispell, MT (US); Paul R. McHugh, Kalispell, MT (US); Benjamin Clay Bradley, Kalispell, MT (US); Aaron Paul Juntunen, Kalispell, MT (US); Deepak Saagar Kalaikadal, Kalispell, MT (US); Daniel Durado, Kalispell, MT (US); Carl Campbell Stringer, Whitefish, MT (US); James Jay Tripp, Kalispell, MT (US); Jason A. Rye, Kalispell, MT (US); John L. Klocke, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/342,991

(22) Filed: Jun. 28, 2023

(65) Prior Publication Data
US 2025/0006519 A1 Jan. 2, 2025

(51) Int. Cl.
*H01L 21/67* (2006.01)
*H01L 21/02* (2006.01)
*H01L 21/673* (2006.01)

(52) U.S. Cl.
CPC .. *H01L 21/67051* (2013.01); *H01L 21/02068* (2013.01); *H01L 21/67376* (2013.01); *H01L 21/67389* (2013.01)

(58) Field of Classification Search
CPC ......... H01L 21/67051; H01L 21/02068; H01L 21/67376; H01L 21/67389
See application file for complete search history.

(56) References Cited

U.S. PATENT DOCUMENTS

| | | | |
|---|---|---|---|
| 5,494,526 A * | 2/1996 | Paranjpe | H01L 21/02046 257/E21.228 |
| 9,613,833 B2 * | 4/2017 | Chua | H01L 21/68764 |

(Continued)

FOREIGN PATENT DOCUMENTS

WO WO-2018132253 A2 * 7/2018 ............... C25D 7/12

OTHER PUBLICATIONS

Machine Translation of TW1762135A (Year: 2022).*

(Continued)

*Primary Examiner* — Sharidan Carrillo
(74) *Attorney, Agent, or Firm* — Kilpatrick Townsend & Stockton LLP

(57) ABSTRACT

Method and systems for cleaning and wetting a semiconductor substrate, are provided. Methods and systems include forming an atmosphere in a basin housing the semiconductor substrate with a gas having a higher solubility in a wetting agent than oxygen. Methods and systems include spraying the wetting agent with a spray head onto the substrate while maintaining the atmosphere. Methods and systems include rotationally translating the semiconductor substrate, the spray head, or both the semiconductor substrate and the spray head, Methods and systems include wetting a plurality of features defined in the substrate.

16 Claims, 5 Drawing Sheets

(56) References Cited

U.S. PATENT DOCUMENTS

| | | | |
|---|---|---|---|
| 9,870,933 B2 | 1/2018 | Engesser et al. | |
| 2010/0320609 A1* | 12/2010 | Mayer | C25D 21/04 |
| | | | 438/758 |
| 2016/0281255 A1* | 9/2016 | Buckalew | C25D 7/123 |
| 2017/0236727 A1* | 8/2017 | Yazawa | H01L 21/68728 |
| | | | 134/18 |
| 2018/0023209 A1 | 1/2018 | Buckalew et al. | |
| 2018/0182664 A1* | 6/2018 | McHugh | C25D 7/12 |
| 2019/0228975 A1* | 7/2019 | Markut | B05C 9/14 |
| 2019/0301049 A1 | 10/2019 | Zimmerman et al. | |
| 2020/0035484 A1 | 1/2020 | Oberst et al. | |

OTHER PUBLICATIONS

Machine Translation of CN114318440A (Year: 2022).*
International Search Report and Written Opinion for PCT/US2024/035507 mailed Oct. 10, 2024, 12 pages.

* cited by examiner

ELECTROPLATING WETTING CHAMBER WITH REDUCED BUBBLE ENTRAPMENT

TECHNICAL FIELD

The present technology relates to wetting substrates in semiconductor processing. More specifically, the present technology relates to systems and methods that provide wetting within vias and other structures with few wetting defects.

BACKGROUND

Integrated circuits are made possible by processes which produce intricately patterned material layers on substrate surfaces. Producing patterned material on a substrate requires controlled methods for applying and removing material. For removal, chemical or physical etching may be performed for a variety of purposes including transferring a pattern in photoresist into underlying layers, thinning layers, or thinning lateral dimensions of features already present on the surface. Once a material has been etched or otherwise processed, the substrate or material layers are cleaned or prepared for further operations.

A typical wafer plating process involves depositing a metal seed layer onto the surface of the wafer via vapor deposition. A photoresist may be deposited and patterned to expose the seed layer. The wafer is then moved into the vessel of an electroplating processor where electric current is conducted through an electrolyte to the wafer, to apply a blanket layer or patterned layer of a metal or other conductive material onto the seed layer. Examples of conductive materials include permalloy, gold, silver, copper, cobalt, tin, and alloys of these metals. Subsequent processing steps form components, contacts and/or conductive lines on the wafer.

Thus, there is a need for improved systems and methods that can be used to produce high quality devices and structures. These and other needs are addressed by the present technology.

BRIEF SUMMARY

The present technology is generally directed to methods and systems for wetting semiconductor substrates. Methods include forming an atmosphere in a basin housing the semiconductor substrate with a gas having a higher solubility in a wetting agent than oxygen, where the semiconductor substrate defines a plurality of features. Methods include spraying the wetting agent with a spray head onto the substrate while maintaining the atmosphere, rotationally translating the semiconductor substrate and the spray head, and wetting the plurality of features defined in the substrate.

In embodiments, methods include where the semiconductor substrate is rotationally translated at a speed of about 50 rpm to about 500 rpm. Furthermore, in embodiments, methods include where the spraying occurs at a pressure of about 20 psi to about 100 psi. In more embodiments, the spraying distributes approximately an even amount of the wetting agent at two or more locations on the substrate based upon an average amount of wetting agent sprayed on the substrate. In yet further embodiments, methods include where the spray head includes one or more spray nozzles, where the one or more spray nozzles are spaced apart from the substrate at a height of about 1 mm to about 100 mm. Moreover, in embodiments, methods include where the atmosphere is a carbon dioxide atmosphere formed by a continuous purge of carbon dioxide, a pump down and backfill of carbon dioxide, and/or a carbon dioxide replacement operation. In embodiments, methods include where the substrate defines at least 1000 features, where less than 5% of the features contain a bubble defect in the wetting agent. Additionally or alternatively, in embodiments, methods include where the wetting agent includes degassed deionized water or a degassed aqueous solution. In yet more embodiments, methods include decreasing a chamber pressure below about 100 kPa during the spraying. Moreover, in embodiments, methods include where the spraying occurs for about 5 seconds to about 90 seconds.

The present technology also generally includes methods of wetting and cleaning a semiconductor substrate. Methods include providing a substrate to a basin housing, where the substrate defines a plurality of features. Methods include displacing air from the plurality of features defined in the substrate with a gas having a Henry's Law coefficient of greater than or about 0.005 005 $mol_g/L_{sol}\cdot atm$ at 23° C. and atmospheric pressure. Methods include spraying a wetting agent onto the substrate with a spray head. Methods include rotationally translating the the semiconductor substrate and wetting the plurality of features defined on the semiconductor substrate.

In embodiments, the gas includes carbon dioxide, carbon monoxide, oxygen, nitrogen, argon, ammonia, bromine, diazene, acetylene, krypton, xenon, radon, nitrous oxide, hydrogen selenide, one or more hydrocarbons, or a combination thereof. In more embodiments, methods include where the wetting agent includes water or an aqueous solution. In embodiments, the semiconductor substrate is rotationally translated at a speed of about 100 rpm to about 300 rpm. Moreover, in embodiments, methods include where the spraying occurs at a pressure of about 30 psi to about 50 psi. In yet further embodiments, methods include where the spray head includes one or more spray nozzles, where the one or more spray nozzles are spaced apart from the substrate at a height of about 1 mm to about 75 mm.

The present technology is also generally directed to wetting and cleaning systems for semiconductor substrates. Systems include a basin having a rim, a rotationally translatable system head, a substrate coupled with the system head, a head seal releasable coupled with an upper surface of the basin rim, a processing volume defined by the head seal and the basin, and a gas inlet. Systems include where the substrate and a spray head are each disposed in the processing volume, and where the gas inlet is fluidly connected with the processing volume and a gas source having a higher solubility in a wetting agent than oxygen.

In embodiments, systems include one or more vacuum inlets in fluid connection with the processing volume and with a system foreline. In more embodiments, systems include where the spray head is disposed adjacent to a lower surface of the basin and includes one or more spray nozzles that extend from the spray head towards a surface of the substrate. In further embodiments, systems include where the system head is in contact with a drive head, and where the spray head is fluidly connected to a wetting agent source.

Such technology may provide numerous benefits over conventional systems and techniques. For example, the processes and assemblies may reduce gas bubbles and residues present in semiconductor substrates after a wetting process. Namely, the processes and assemblies may significantly increase substrate plating uniformity due to more even wetting and additional residue cleaning during wetting processes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
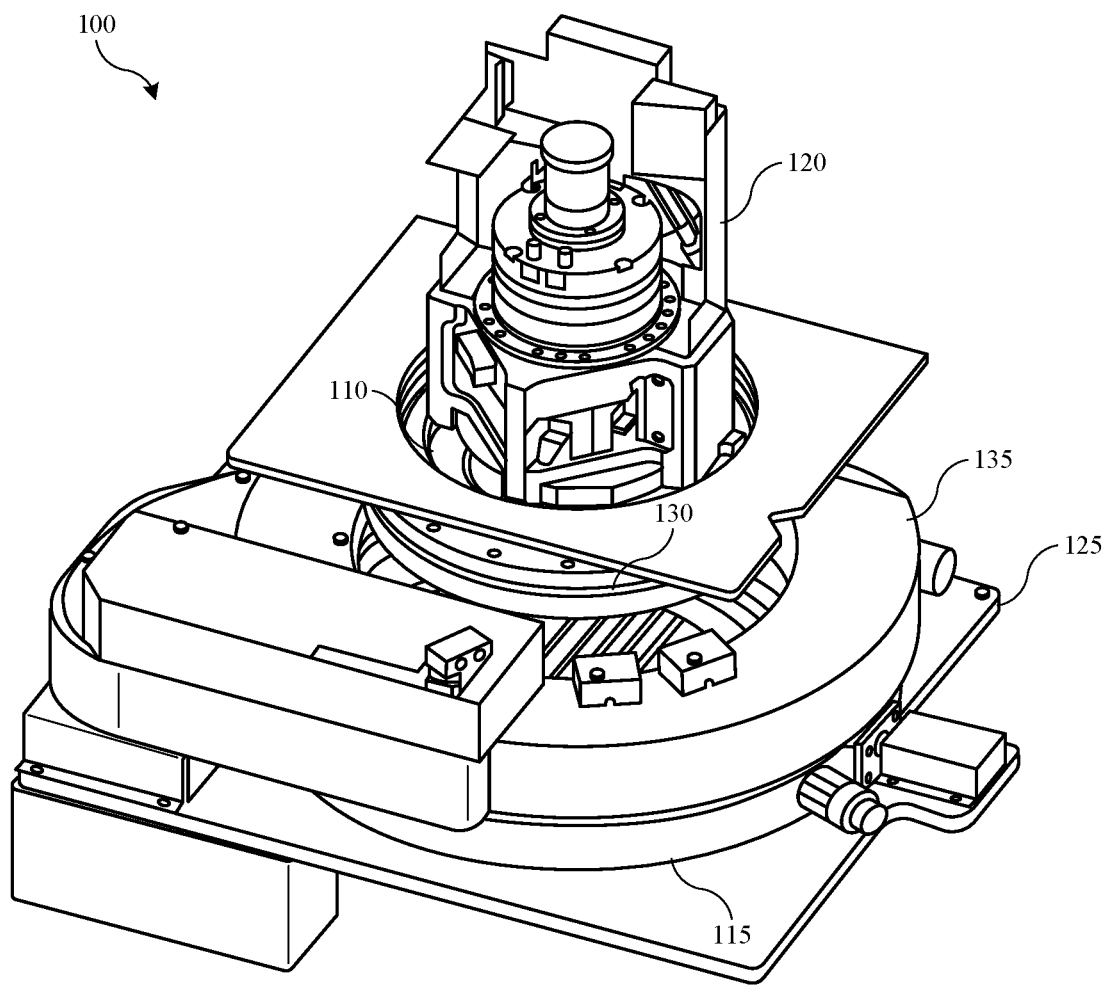
FIG. 1 shows a schematic perspective of an exemplary processing chamber according to embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Various operations in semiconductor manufacturing and processing are performed to produce vast arrays of features across a substrate. As layers of semiconductors are formed, vias, trenches, and other pathways are produced within the structure. These features may then be filled with a conductive or metal material that allows electricity to conduct through the device from layer to layer. As device features continue to shrink in size, so too does the amount of metal providing conductive pathways through the substrate. As the amount of metal is reduced, the quality of the plated materials and coating thereof may become more critical to ensure adequate electrical conductivity through the device. Accordingly, manufacturing may desire to reduce or remove imperfections and discontinuities in the pathway.

Electroplating operations may be performed to provide conductive material into vias and other features on a substrate. Electroplating utilizes an electrolyte bath containing ions of the conductive material to electrochemically deposit the conductive material onto the substrate and into the features defined on the substrate. Processing may involve a wetting process in which the surfaces and vias of the substrate are wetted prior to electroplating. When a substrate is introduced to a wetting operation, it is often dry and exposed to air, although residual liquid such as from a pre-clean operation may also be present. A purpose of such wetting operations is to reduce the areas where plating may not occur due to air bubbles being trapped within the features. If these bubbles are not dislodged, then the bubbles may act as blocking sites to the subsequent plating operation. In addition, residual process materials, referred to as residues herein to refer to remaining materials and particles, from preceding process steps may remain in vias due to inadequate preclean. Such residual materials and/or particles may also serve as blocking sites to plating chemistries and operations. When features do not receive adequate plating, the interconnect functions may not operate effectively, which may lead to device issues or failure.

Efforts have been made to improve both air bubble entrapment and residue removal from vias during wetting operations. One such effort was to dip a substrate into a wetting liquid under vacuum. When the vacuum was removed, any bubbles present would shrink, allowing more complete removal. However, such a process failed to fully remove all bubbles, and also failed to remove residues present. Conventional methods have also utilized spraying wetting chemistries onto substrates. While such efforts have improved the cleaning of residual materials, spraying operations proved insufficient for removal of entrapped bubbles.

The present technology overcomes these and other deficiencies by displacing air in the chamber with a gas having a higher solubility in water or aqueous solutions than air and utilizing a robust spray operation to fully coat the substrate with one or more passes of a wetting agent, which may be water or an aqueous solution. In such a manner, any air bubbles present may be replaced with gas or gas bubbles that may more easily dissolve into the aqueous solution. In addition, the sprayed aqueous solution is actively cleaning any residues present while removing bubbles. Thus, the present technology has surprisingly found that both robust cleaning and removal of air and/or gas bubbles may be conducted simultaneously when utilizing the methods and assemblies discussed herein. Therefore, the present technology may also provide wetting substrates with reduced or even eliminated blocking sites from residues and trapped air or gasses, allowing the formation of high quality substrates during electroplating processes.

The remaining disclosure will routinely identify specific process chambers and wetting processes utilized in conjunction with the discussed processing chambers. However, it will be readily understood that the systems and methods are equally applicable to other substrates and chambers that would benefit from improved cleaning and reduced defects during process cycling. Accordingly, the technology should not be considered to be so limited as for use with these specific devices or systems alone. The disclosure will discuss one possible semiconductor processing chamber that may include one or more components according to embodiments of the present technology before additional variations and adjustments to this apparatus according to embodiments of the present technology are described.

FIG. 1 a schematic perspective view of a system 100 that can perform plating methods and/or wetting methods according to embodiments of the present technology. In embodiments, system 100 may be operable to perform both electroplating operations and electroless plating operations, as well as wetting operations. However, in embodiments, system 100 may be configured only for wetting operations, and a substrate may be transferred between chambers between wetting and plating operations. System 100 illustrates an exemplary system, including a system head 110 and a bowl 115. During operations, a substrate may be releasably affixed to the system head 110, inverted, and extended into bowl 115 to perform one or more operations. Plating system 100 may include a head lifter 120, which may be configured to both raise and rotate (e.g., spin) the head 110, or otherwise position the head within the system, including tilting operations. The head and bowl may be attached to a deck plate 125 or other structure that may be part of a larger system incorporating multiple systems 100 (e.g., one or more plating systems and one or more wetting systems), and which may share electrolyte and other materials. A rotor may allow a substrate clamped to the head to be rotated within the bowl or outside the bowl in different operations. The rotor may include a one or more rotor seals to maintain a solid connection and seal between head 110 and rotor during spinning operations. A seal 130 may be connected with the head, and may chuck a wafer to be processed, or may otherwise maintain the substrate on head 110 during operation.

Figure 2:
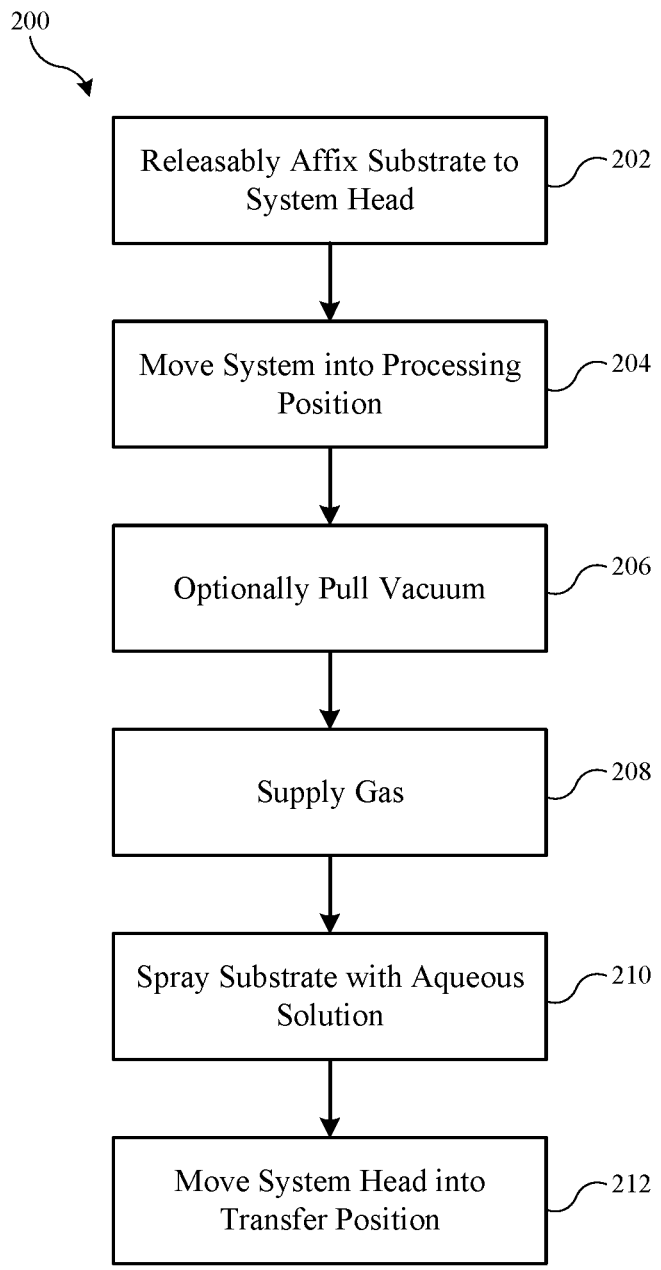
FIG. 2 shows selected operations in a formation method according to embodiments of the present technology.

FIG. 2 shows exemplary operations in a method 200 according to some embodiments of the present technology. The method may be performed in a variety of processing chambers, including a processing chamber disposed within system 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Figure 4:
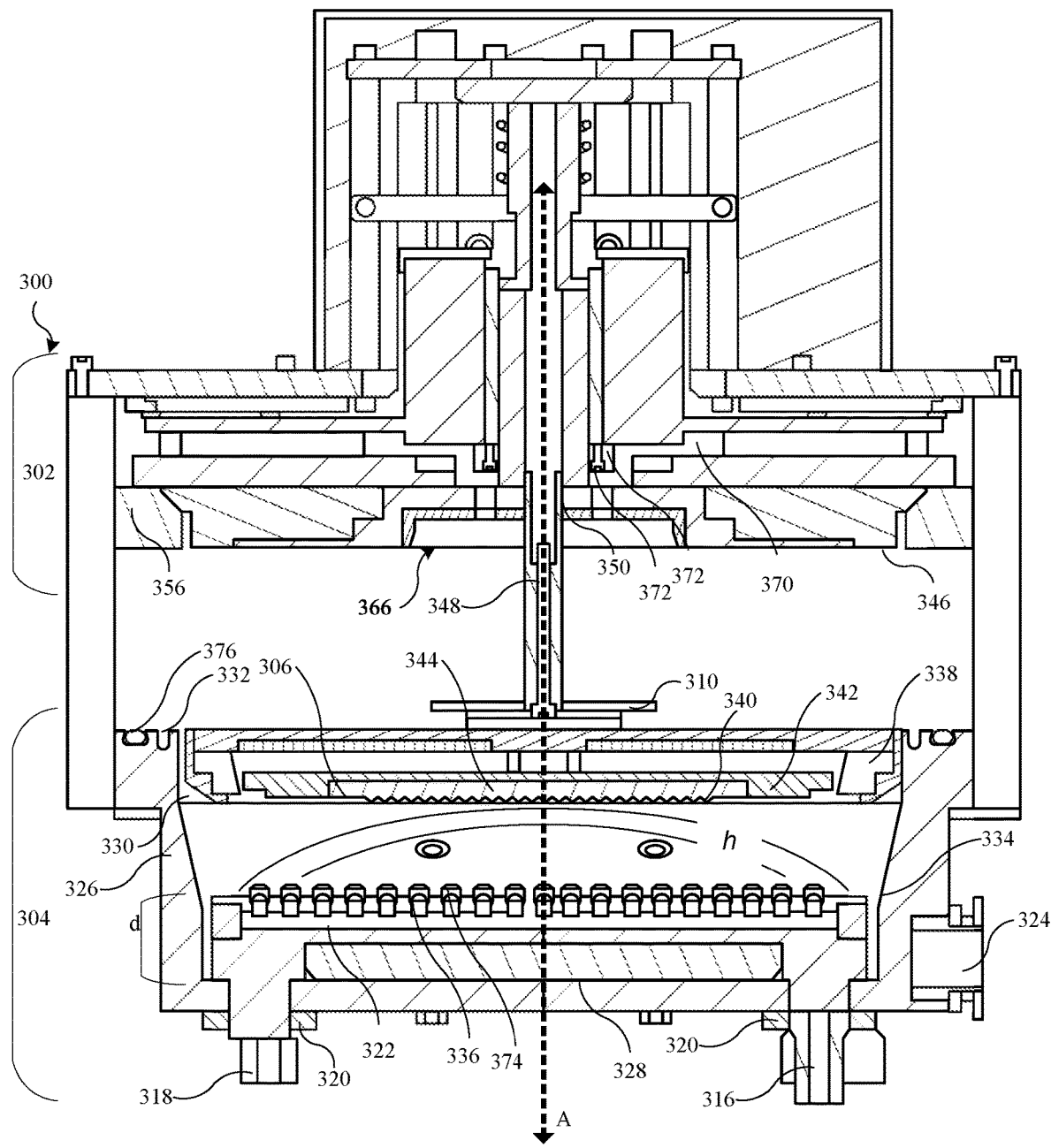
FIG. 4 illustrates a cross-sectional view of a wetting chamber according to embodiments of the present technology.
Figure 5:
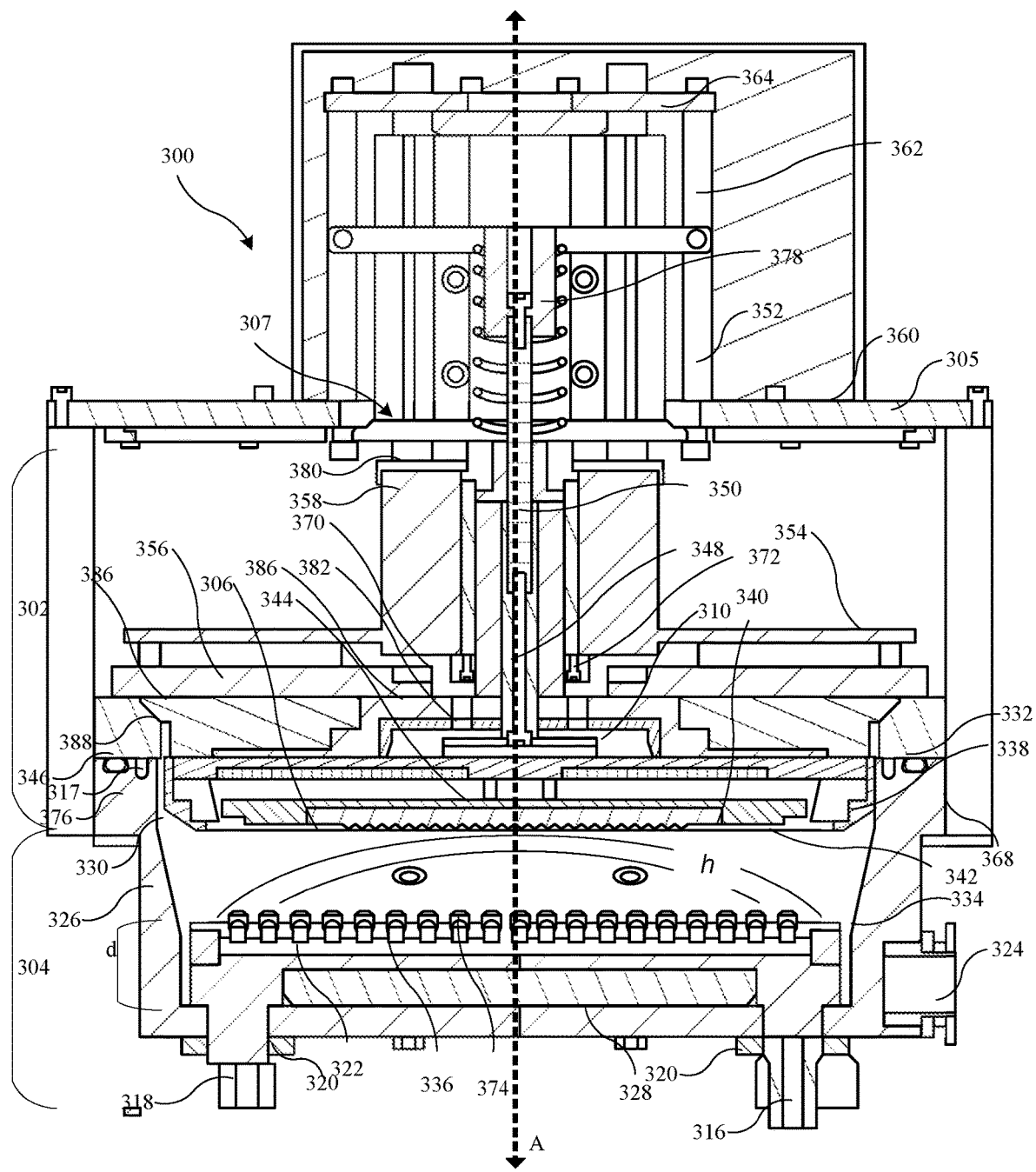
FIG. 5 illustrates a cross-sectional view of a wetting chamber according to embodiments of the present technology.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber disposed within system 100 described above, or other chambers that may include components as described above. Method 200 describes operations to develop the wetting apparatus 300 illustrated in FIGS. 3-5, the illustration of which will be described in conjunction with the operations of method 200. It is to be understood that FIGS. 3 to 5 illustrate only partial schematic views, and wetting chambers according to the present technology may include further components as illustrated in the figures, as well as alternative components, of any size or configuration that may still benefit from aspects of the present technology.

Figure 3:
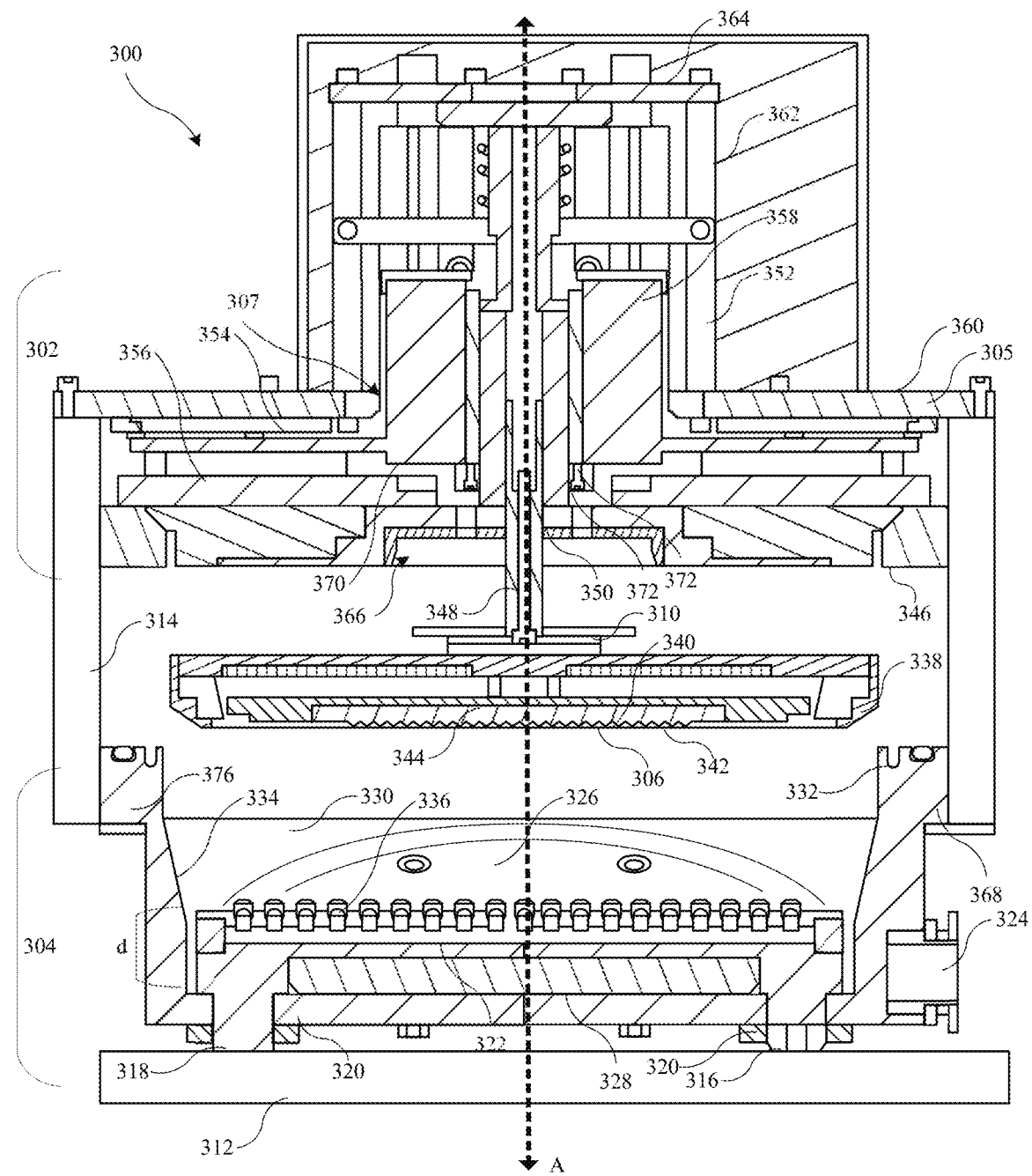
FIG. 3 illustrates a cross-sectional view of a wetting chamber according to embodiments of the present technology.

FIG. 3 illustrates a partial cross-sectional view of a wetting apparatus 300 according to embodiments of the present technology. FIG. 3 may illustrate a wetting apparatus 300 in a transfer position. Namely, while it should be understood that, in embodiments as discussed above, a substrate 306 may not be transferred between chambers, and may instead undergo multiple processing steps in the same chamber, in embodiments, the wetting apparatus 300 may be configured to easily affix and remove substrates 306 from a system head 310. For instance, even if multiple processing steps are conducted in wetting apparatus 300, a transfer position may simplify the attachment and removal of a substrate 306 from the system head 310 prior to and subsequent the processing. Thus, in embodiments, at operation 202, a substrate 306 may be coupled with a system head 310.

Continuing to refer to FIG. 3, the wetting apparatus 300 includes a base 312, one or more sidewalls 314 connecting the bowl assembly 304 to the head assembly 302, and an upper wall 305. The upper wall 305 may define a central aperture 307 around an approximate central axis A in the upper wall 305, and the central aperture may be shaped and sized to receive a portion of the head assembly 302, such as a drive head, which will be discussed in greater detail below. A bowl assembly 304 may be attached to base 312 using one or more support legs 316, although only one is illustrated in order to more clearly show vacuum connections 318. Each vacuum connection 318 may be in fluid connection with a system foreline (not shown) or other vacuum assembly as known in the art. In addition, by including one or more vacuum inlets 317 in fluid connection with the vacuum connections 318 along rim 376 of basin 326, contaminants from system head 310 may be pulled laterally, and contaminants from bowl assembly 304 may be pulled vertically, without cross-contaminating one another. In embodiments, the one or more vacuum inlets 317 may extend circumferentially around rim 376, with one or more connections to the processing volume. The bowl assembly 304 also includes a basin 326, one or more spray head manifolds 320 which may be in fluid connection with a wetting agent source (not shown) and spray head 322. Moreover, bowl assembly 304 includes a drain manifold 324 which may be in fluid connection with a bottom surface 328 of basin 326 and a drain outlet (not shown), for removing an aqueous solution from basin 326 after a wetting operation has been completed. While the basin 326 is illustrated as having a slanted or curved profile from a basin fill rim 330 to the bottom surface 328, it should be understood that, in embodiments, the bottom surface may be generally planar, or only contain a large radius of curvature dished profile (e.g. low curvature).

For instance, as may be discussed in greater detail below, in embodiments, it may be desired to utilize a vacuum environment during one or more of the wetting operations discussed herein. Thus, in such embodiments, it may be beneficial to decrease the volume of the bowl assembly 304 (e.g. volume formed between basin upper surface 332, basin sidewalls 334, and basin bottom surface 328), to decrease pump-down time and/or air displacement time, while still providing ample fill distance d between basin bottom surface 328 and spray head 322. Namely, if vacuum is utilized, any aqueous solution sprayed from spray head 322 may not be drained until after the wetting operation is complete. Thus, it may be beneficial to ensure the distance d can accommodate a total volume of aqueous solution for a wetting operation discussed herein, such that the spray head nozzles 336 remain above an aqueous solution height during all spray operations. Such a distance d may therefore prevent contamination from any residues sprayed from a substrate 306, as they may drop into basin 326 during a wetting operation. Therefore, in embodiments, it may be desired to utilize a basin 326 having one or more slanted sides in order to decrease the total volume of the bowl assembly 304 while still maintaining a distance d that retains spray head nozzles 336 above an aqueous solution height (not shown).

In addition, while basin 326 is shown as having a generally circular cross-sectional shape, it should be understood that basin 326 may have any shape. Thus, in embodiments, basin 326 may have a quadrilateral shape, star shape, oval shape, heptagonal shape, hexagonal shape, as well as others as known in the art.

Nonetheless, while spray head 322 is illustrated as having a plurality of spray head nozzles 336, it should be understood that, in embodiments, spray head 322 may only contain one spray head nozzle 336, or such as greater than or about 2 nozzles, such as greater than or about 3 nozzles, such as greater than or about 4 nozzles, such as greater than or about 5 nozzles, such as greater than or about 10 nozzles, such as greater than or about 15 nozzles, such as greater than or about 20 nozzles, such as less than or about 20 nozzles, such as less than or about 18 nozzles, such as less than or about 16 nozzles, such as less than or about 14 nozzles, such as less than or about 12 nozzles, such as less than or about 10 nozzles, such as less than or about 5 nozzles, or any ranges or values therebetween. In addition, while spray head 322 is illustrated as a spray bar with a generally even distribution of spray head nozzles 336, it should be understood that spray head may only extend across a portion of the basin 326 width, may be a spray arm that moves or rotates during process, or may have an uneven distribution of nozzles, so long as an average spray time remains consistent for each point on substrate 306.

For instance, while spray head 322 is illustrated as a spray bar having a one or more cylindrical spray head nozzles 336, the spray head 322 may instead include one spray head nozzle 336 having a greater horizontal length (e.g. a rectangular spray bar), and/or if the basin 326 is circular, having a length extending generally co-planar with an x-axis that is from about 10% to about 90% of a width of the basin 326 bottom surface 328, such as less than or about 80%, such as less than or about 70%, such as less than or about 60%, such as less than or about 50%, such as less than or about 40%, such as less than or about 35%, such as less than or about 30%, such as less than or about 25%, such as less than or about 20%, such as less than or about 15%, or any ranges or values therebetween.

In FIG. 3, the spray head nozzles 336 are illustrated as being stationary, and having a generally cylindrical shape. However, in embodiments, spray head nozzles 336 may have a quadrilateral shape, star shape, oval shape, heptagonal shape, hexagonal shape, as well as others shapes as known in the art. Namely, as will be discussed in greater detail below, the overall shape and size (e.g. cross sectional width or diameter) of each spray head nozzle 336 and/or the number of spray head nozzles 336 may be selected to as to provide a spray that is generally evenly distributed across the surface of substrate 306 on a time average basis or based upon an average amount sprayed upon the substrate. Additionally or alternatively, while not illustrated, it should be understood that spray head 322 may be movable or rotatable in embodiments.

Regardless of the spray head 322 orientation, as illustrated in FIG. 3, the bowl assembly 304 may also include one or more additional nozzles, such as one or more side clean nozzles 368. A side clean nozzle 368 may extend through a rim 376 of basin 326, in some embodiments and be directed to rinse seal assembly 338, along with aspects of substrate 306.

While not illustrated, in embodiments, one or more side clean nozzles 368 may be present, where each side clean nozzle 368 may have a different rinse angle from an adjacent side clean nozzle 368, so as to target a bottom, side, or upper portion, of seal assembly 338. As illustrated, the rim 376 may extend circumferentially about an upper surface of basin 326.

Moreover, in embodiments, bowl assembly 304 may also include a receiving volume defined between basin fill rim 330, basin sidewalls 334, and basin upper surface 332. As illustrated more clearly in FIG. 4, the receiving volume may be partially or fully occupied by all or a portion of system head 310 when the system head 310 is translated into a processing position. Regardless, the receiving volume may be disposed vertically above the one or more spray head nozzles 336.

In FIG. 3, the substrate 306 is shown as being coupled with the system head 310 utilizing a seal assembly 338 incorporated with system head 310. In the illustrated embodiment. the seal assembly 338 may both protect the substrate 306 backside 340 (e.g. the surface opposite a work surface 342) from being contacted by an aqueous solution during wetting operations, as well as provide an electrical contact via chucking pins 344. In such a manner, the entire seal assembly 338, with the substrate 306 maintained therein, may be transferred to an electroplating apparatus after wetting operations discussed herein. However, it should be clear that in embodiments, the substrate 306 may be coupled directly with system head 310 or via one or more seals and incorporated into an electroplating seal assembly after wetting operations discussed herein have been completed.

Nonetheless, in a transfer position, the substrate may be disposed between basin upper surface 332 and head assembly 302 lower surface 346. Namely, a lift pin 348 may be received in a central shaft 350 extending through head assembly 302 and drive head 358. In embodiments, the central shaft 350 may extend in a plane generally parallel to, or along, central axis A of the wetting apparatus 300. As used herein, "generally parallel or along" may refer to a plane or line that is less than or about 15 degrees from parallel, such as less than or about 10 degrees, such as less than or about 5 degrees, such as less than or about 2.5 degrees, such as less than or about 1 degree from parallel with the reference plane or line, or any ranges or values therebetween. The lift pin 348 may be connected to a motor, such as a linear actuator, that translates the lift pin 348, and therefore the system head 310, vertically between one or more vertical locations. In the transfer position, the lift pin 348 may only be partially received in the central shaft 350. For instance, from about 20% to about 80% of the length of the lift pin 348, based upon the total length of the lift pin 348, may be disposed within central shaft 350, such as less than or about 70%, such as less than or about 65%, such as less than or about 60%, such as less than or about 55%, such as less than or about 50%, such as less than or about 45%, such as less than or about 40%, such as less than or about 35%, such as less than or about 30%, or such as greater than or about 20%, such as greater than or about 25%, such as greater than or about 30%, such as greater than or about 35%, such as greater than or about 40%, such as greater than or about 45%, such as greater than or about 50%, or any ranges or values therebetween. As illustrated, lift pin 348 may translate system head 310 independently of head assembly 302.

In the transfer position, the substrate 306 and/or seal assembly 338 and system head 310 may be accessed for removal from wetting apparatus 300. Thus, in embodiments, the wetting apparatus 300 may only contain a first sidewall 314 and an opposed second sidewall 314. In such a manner, a third side and opposed fourth side of the wetting apparatus 300 may remain open, allowing access to the substrate 306 and/or seal assembly 338 from a location exterior of the wetting apparatus without requiring disassembly of the wetting apparatus 300. However, it should be understood that, in embodiments, the wetting apparatus 300 may be fully enclosed and/or contain one or more sidewalls, such as two or more sidewalls, such as three or more sidewalls, such as four or more sidewalls, and instead contain a transfer aperture or removable wall, or allow for full disassembly, to access substrate 306 and/or seal assembly 338.

Referring again to FIG. 3, in the transfer position, the head assembly 302 may be in a fully retracted position. For instance, an upper surface 354 of head seal 356 may be disposed adjacent to upper wall 305, and drive head 358 may be partially or fully received within lift frame 352. As shown, in embodiments, the lift frame 352 may be coupled with an exterior surface 360 of upper wall 305, extending in a direction generally orthogonal from upper wall 305 and circumferentially around central aperture 307. For instance, in embodiments, lift frame 352 may define one or more upstanding portions 362, which may be one or more pairs of opposed sidewalls, in embodiments, that are generally orthogonal to upper wall 305 (e.g. extending in a plane that is less than or about 15 degrees from perpendicular with upper wall 305, such as less than or about 10 degrees, such as less than or about 5 degrees, such as less than or about 2.5 degrees, such as less than or about 1 degree from perpendicular with upper wall 305, or any ranges or values therebetween). In addition, lift frame 352 may define an upper portion 364 that is approximately co-planar with upper wall 305. Nonetheless, lift frame 352 may include one or more drive elements, such as springs (shown more clearly in FIG. 5), linear actuators, such as a compression spring, driven chains, air cylinders, the like, and combinations thereof, for vertically translating head assembly 302.

In the transfer position, the head assembly 302 may define a central recess 366 circumferentially around a central axis A, in a lower surface 346 of head seal 356. The central recess 366 may have a shape and size to receive system head 310 in a processing position. In addition, the head assembly 302 may define a plenum 370, which may be in fluid connection with the processing volume in a processing position, which will be discussed in greater detail below. The head assembly 302 may be rotatable in embodiments. Thus, the head assembly 302 may include one or more rotary seals 372 between drive head 358 and head assembly 302. Thus, in embodiments, drive head 358 may be configured to rotationally translate the head assembly 302 and system head 310, which will be discussed in greater detail below.

FIG. 4 illustrates the wetting apparatus 300 partially transitioned from the transfer orientation. Namely, as illustrated, the system head 310 has transitioned vertically downward into the receiving volume of bowl assembly 304. However, in the partially transitioned orientation, the head assembly 302 (e.g. upper surface 354) may remain disposed adjacent to upper wall 305 of wetting apparatus 300 (shown more clearly in FIG. 3). It should be understood that, in embodiments, no partial transition orientation may be utilized, or may be present for a relatively short period of time, such that the wetting apparatus 300 appears to transition from the transfer position to the processing position of FIG. 5. However, in embodiments, it may be desirable to utilize a partially transitioned orientation of FIG. 4 in order to ensure proper seating of the seal 338, if utilized, against basin 326, proper centering, and/or adjustment of a height h between substrate 306 and an upper surface 374 of spray head nozzles 336.

For example, in embodiments, the upper surface 374 of one or more of spray head nozzles 336 (e.g. each spray head nozzle 336 in embodiments) may be positioned at a height of less than or about 100 mm from the substrate 306 work surface 342, such as less than or about 90 mm, such as less than or about 80 mm, such as less than or about 70 mm, such as less than or about 60 mm, such as less than or about 55 mm, such as less than or about 50 mm, such as less than or about 45 mm, such as less than or about 40 mm, such as less than or about 35 mm, such as less than or about 30 mm, such as less than or about 25 mm, such as less than or about 20 mm, such as less than or about 15 mm, such as less than or about 10 mm, such as less than or about 5 mm, such as less than or about 2.5 mm, such as less than or about 1 mm, or such as greater than or about 1 mm, such as greater than or about 2 mm, such as greater than or about 2 mm, such as greater than or about 4 mm, such as greater than or about 5 mm, such as greater than or about 7.5 mm, such as greater than or about 10 mm, such as greater than or about 12.5 mm, such as greater than or about 15 mm, such as greater than or about 17.5 mm, such as greater than or about 20 mm, such as greater than or about 25 mm, such as greater than or about 30 mm, such as greater than or about 35 mm, such as greater than or about 40 mm, such as greater than or about 45 mm, such as greater than or about 50 mm, or any ranges or values therebetween. Namely, a height according to any one or more of the above heights may provide for excellent cleaning of any residues present without damaging substrate 306.

As noted above, the lift pin 348 may be connected to a motor, such as a linear actuator, that translates the lift pin 348, and therefore the system head 310, vertically between the vertical locations. In the partially transitioned orientation, the lift pin 348 may only be partially received in the central shaft 350. For instance, from about 1% to about 50% of the length of the lift pin 348, based upon the total length of the lift pin 348, may be disposed within central shaft 350, such as less than or about 45%, such as less than or about 40%, such as less than or about 35%, such as less than or about 30%, such as less than or about 25%, such as less than or about 20%, such as less than or about 15%, such as less than or about 10%, such as less than or about 5%, or such as greater than or about 2%, such as greater than or about 3%, such as greater than or about 4%, such as greater than or about 5%, such as greater than or about 6%, such as greater than or about 7%, such as greater than or about 8%, or any ranges or values therebetween. Thus, by utilizing one or more of the above ranges, the system head 310 may be provided with sufficient lateral support to center or position the system head 310 for processing while allowing for vertical translation of the system head 310.

Nonetheless, FIG. 5 illustrates the second step (if a partial transition is utilized) of operation 204, which includes moving the system into the processing position or orientation.

Namely, as illustrated, the head assembly 302 has been translated to a position below the head assembly position in the transfer orientation, such that the lower surface 346 of head seal 356 contacts upper surface 332 of basin 326, and the system head 310 is fully received in central recess 366. In such a manner, a robust seal may be formed between the bowl assembly 304 and head assembly 302, preventing the entrance of outside gasses (such as air), and exit of gasses contained in the bowl volume during processing.

In addition, as shown in FIG. 5, by translating the head assembly 302 into the processing position such that the system head 310 is received in central recess 366, the lift pin 348 may be fully received in central shaft 350. In addition, drive head 358 is fully disposed below upper wall 305. Namely, while a portion of the drive head 358 may be disposed within lift frame 352 (e.g. vertically above the plane of upper wall 305) in a transfer orientation, in the processing orientation, greater than or about 75% of a height of a drive head based upon a total height of the drive head 358 may be disposed below upper wall 305, such as greater than or about 80%, such as greater than or about 85%, such as greater than or about 90%, such as greater than or about 95%, such as up to about 100% (e.g., top surface 380 of drive head 358 is disposed below upper wall 305), or any ranges or values therebetween. In such a manner, the lift pin 348 may firmly engage with drive head 358, and the drive head 358 may be oriented in the apparatus 300 to provide for free rotation, such that the entire system head 310, and therefore substrate 306 may be driven rotationally during processing.

Thus, in embodiments, in the processing orientation, the lift pin 348 may be fully received in the central shaft 350. For instance, from about 60% to about 100% of the length of the lift pin 348, based upon the total length of the lift pin 348, may be disposed within central shaft 350, such as greater than or about 66%, such as greater than or about 70%, such as greater than or about 75%, such as greater than or about 80%, such as greater than or about 85%, such as greater than or about 90%, such as greater than or about 95%, or such as less than or about 99.9%, such as less than or about 99%, such as less than or about 98%, such as less than or about 97%, such as less than or about 96%, such as less than or about 95%, or any ranges or values therebetween. By utilizing one or more of the above ranges, the system head 310 may be provided with sufficient lateral support to center or position the system head 310 for rotation, as well as rotate the substrate at a desired speed, during processing.

Moreover, in the processing orientation, plenum 370 may be in a fluid connection with inlets 382. Thus, in embodiments, a gas may be diffused into central recess 366 and flow path 386. By maintaining a split flow path between plenum 370 and central recess 366, contamination between the basin 326 and system head 310 may be prevented while allowing for vacuum to be pulled and gas to be introduced. As illustrated the flow path 386 may extend generally parallel to upper surface 354 and extends radially outward from central axis A, and extends downward along side wall 388, into the processing volume. Such a flow path allows for the gradual diffusion of a gas (e.g. any one or more of the gasses discussed below having a higher solubility than air) through head seal 356, around system head 310, around seal assembly 338 and into the bowl volume between basin sidewall 334 and seal assembly 338. Such a flow path allows for the gradual introduction of diffuse gas as the gas expands into the processing volume from the flow path.

For instance, in embodiments, operation 206 can include an optional vacuum evacuation of atmospheric gasses contained within the bowl volume. Namely, as discussed above, the present technology has surprisingly found that by displacing air with a gas having a higher solubility then air at operation 208, reduction and/or removal of bubbles present after a wetting process is greatly improved. However, in embodiments it may be beneficial to also evacuate air in the processing volume prior to introducing the gas, or two or more cycles of evacuation and introduction of gas. In such a manner, a low-pressure vacuum environment may be created which may further improve the removal of gas or air bubbles when the vacuum is released. Namely, air or gas bubbles present may expand when under vacuum, and may shrink upon release of the vacuum, improving removal of the bubbles. In addition, evacuation may also improve the speed of displacement of air in the chamber as well as increase the efficiency of displacement of air. However, in embodiments, other displacement methods, such as continuous purge of a gas having a higher solubility than air, may be utilized.

Nevertheless, with atmospheric pressure being approximately 101 kPa, the chamber pressure may be maintained below about 100 kPa during one or more operations of the present technology. In some embodiments the pressure may be further reduced to below or about 90 kPa, below or about 80 kPa, below or about 70 kPa, below or about 60 kPa, below or about 50 kPa, below or about 40 kPa, below or about 30 kPa, below or about 20 kPa, below or about 15 kPa, below or about 10 kPa, below or about 9 kPa, below or about 8 kPa, below or about 7 kPa, below or about 6 kPa, below or about 5 kPa, below or about 4 kPa, below or about 3 kPa, below or about 2 kPa, below or about 1 kPa, or lower, or any ranges or values therebetween. The pressure may also be maintained between any of these stated numbers, or within ranges encompassed by any of these ranges for any of the operations of the present technology.

The reduction in pressure may be at least partially limited to the saturation pressure of the wetting agent, which may be between about 1 kPa and about 4 kPa, for water or aqueous solutions. By reducing the pressure towards the saturation pressure of the wetting agent, the amount of trapped and free gas within the features may be reduced. As the pressure within the system is reduced, the number of moles of gas will be proportionately reduced, which may reduce the amount of gas to be absorbed by the wetting agent. Accordingly, in some embodiments the chamber pressure may be maintained below about 20 kPa, below about 10 kPa, between about 1 kPa and about 20 kPa, or between about 4 kPa and about 10 kPa to reduce the amount of gas to be displaced. However, it should be understood that, in embodiments, no vacuum may be necessary to provide improved or even full removal of bubbles utilizing the processes and systems according to the present technology.

For example, as noted previously, the gas being displaced in some wetting operations may be air at atmospheric conditions. Additionally, the wetting agent may include water or an aqueous solution. The ability of water to absorb oxygen and nitrogen, which constitute about 99% of air, is less than the ability of water to absorb many other materials. Reducing the pressure within a system may increase the absorption rate of oxygen and nitrogen indirectly by reducing the amount of gas to be absorbed, although the time to fully absorb the gases may be many minutes or more. This will reduce substrate throughput if that amount of time is required for each substrate, such as a semiconductor wafer, and the process may not fully remove the air from each of the features. However, by adjusting the wetting agent and the atmosphere of the process according to the present technology, these process times may be reduced.

The displaced atmosphere according to the present technology may be referred to as a controlled atmosphere as noted above. In embodiments, the controlled atmosphere may contain an amount of one or more gasses, and also may be characterized by an amount of air. For example, the controlled atmosphere may include constituents in which oxygen and nitrogen together form less than 99% of the controlled atmosphere. In some embodiments, oxygen and/or nitrogen may form less than or about 90% of the controlled atmosphere, and may be included as less than or about 80%, less than or about 70%, less than or about 60%, less than or about 50%, less than or about 40%, less than or about 30%, less than or about 20%, less than or about 10%, less than or about 5%, less than or about 1% of the controlled atmosphere, or less in embodiments. Additionally, one or more other fluids, including carbon dioxide or other materials discussed herein may include more than or about 1% of the controlled atmosphere, and the carbon dioxide and/or other fluids may make up greater than or about 5% of the controlled atmosphere, greater than or about 10%, greater than or about 20%, greater than or about 30%, greater than or about 40%, greater than or about 50%, greater than or about 60%, greater than or about 70%, greater than or about 80%, greater than or about 90%, greater than or about 99% of the controlled atmosphere, or the fluids may substantially, essentially, or completely make up the controlled atmosphere in embodiments.

The gasses (also referred to herein as "fluids" or capable of being in fluid connection) may include any fluid or gas for displacing the air, and are not limited to carbon dioxide, which is discussed throughout as an exemplary fluid for the controlled atmosphere. A non-exhaustive list of gases that may be used includes, for example, carbon dioxide, carbon monoxide, oxygen, nitrogen, argon, ammonia, bromine, diazene, acetylene, krypton, xenon, radon, nitrous oxide, hydrogen selenide, and other gases. Additionally hydrocarbons may be used including methane, ethane, propane, butane, etc. The selection of a gas or gases may be based on their solubility in water or an aqueous solution, and a gas may be selected based on the associated Henry's Law coefficient in water. For example, oxygen may be characterized by a coefficient of approximately 0.0013 $mol_g/L_{sol}$·atm, and nitrogen may be characterized by a coefficient of approximately 0.0006 $mol_g/L_{sol}$·atm. Carbon dioxide by comparison may be characterized by a coefficient of approximately 0.03 $mol_g/L_{sol}$·atm, which is at least an order of magnitude higher than oxygen and nitrogen. Accordingly, carbon dioxide may be many times more readily absorbed in water and other aqueous solutions than oxygen or nitrogen. In embodiments, other fluids that may be selected may be characterized by a Henry's Law coefficient of greater than or about 0.005 $mol_g/L_{sol}$·atm at comparable operating conditions (such as room temperatures (23°) and atmospheric pressures) such as greater than or about 0.0075 $mol_g/L_{sol}$·atm, such as greater than or about 0.01 $mol_g/L_{sol}$·atm, such as greater than or about 0.02 $mol_g/L_{sol}$·atm, or any ranges or values therebetween.

In addition, by selecting a gas to displace air present in the processing volume according to one or more of the above Henry's Law coefficients, the gas absorption time, even at atmospheric pressures, may be drastically reduced. Thus, the present technology has surprisingly found that by carefully selecting a gas having a high absorbency in water or aqueous solution, dipping and maintaining a substrate in the aqueous solution may not be necessary to facilitate robust bubble removal. Namely, at operation 210, the present technology has found that spraying the substrate with an aqueous solution after displacement with gas as discussed above results in both robust bubble displacement as well as the removal of any residues present on the substrate (e.g. in one or more vias).

Namely, by utilizing one or more of the heights h discussed above between an upper surface 374 of the one or more spray nozzles 336 and the substrate 306 alone or in conjunction with a tailored pressure, robust residue removal may be achieved without damaging the substrate. For instance, in embodiments, the pressure of the aqueous solution, measured at the one or more spray nozzles 336, may be greater than or about 10 psi, such as greater than or about 15 psi, such as greater than or about 20 psi, such as greater than or about 25 psi, such as greater than or about 30 psi, such as greater than or about 35 psi, such as greater than or about 40 psi, such as greater than or about 45 psi, such as greater than or about 50 psi, such as greater than or about 55 psi, such as greater than or about 60 psi, such as greater than or about 65 psi, such as greater than or about 70 psi, such as greater than or about 75 psi, such as greater than or about 80 psi, such as greater than or about 85 psi, such as greater than or about 90 psi, such as greater than or about 95 psi, such as greater than or about 100 psi, or such as less than or about 125 psi, such as less than or about 120 psi, such as less than or about 115 psi, such as less than or about 110 psi, such as less than or about 105 psi, such as less than or about 100 psi, such as less than or about 90 psi, such as less than or about 80 psi, such as less than or about 70 psi, such as less than or about 60 psi, or any ranges or values therebetween.

By delivering an aqueous solution directly up from below the wafer, or at a slight angle as illustrated in some embodiments, the velocity of the delivery may be robust, but low enough to minimize damage to the substrate. For instance, in embodiments, there portion of spray head 322 disposed directly below the substrate 306 about or near central axis A may be free of spray heads nozzles 336 in order to prevent damage to substrate 306. Nonetheless, in embodiments, rotation of the system head 310 and/or spray head 322 may be used to draw the rinse fluid radially outward along the substrate 306. The tailored velocity of delivery may limit upward splashing (e.g. maintain the aqueous solution in contact with the substrate) and damage, and may ensure an improved central delivery of fluid. For example, some side nozzles that eject fluid at an angle towards the substrate may not directly contact a regions of the substrate. However, while not necessary in all embodiments, such as when the substrate 306 may be transferred alone, in embodiments, one or more side clean nozzles 368 may be utilized during operation 210 or after operation 210 in order to clean the system head 310 and/or seal assembly 338.

Nonetheless, in embodiments one or more of the system head 310 and/or spray head 322 may be rotated, such as by utilizing drive head 358 at a speed sufficient to evenly distribute the aqueous solution and provide good cleaning of the substrate. Namely, by rotating one or more of the system head 310 and/or spray head 322, multiple passes of each portion of the substrate 306 over one or more spray nozzles 336 may be achieved, ensuring excellent cleaning of residues as well as aqueous solution contact time for absorption of air or gasses.

Thus, in embodiments, at least one of the system head 310 and spray head 322 may rotate at a speed of greater than or about 1 rpm, such as greater than or about 5 rpm, such as greater than or about 10 rpm, such as greater than or about 20 rpm, such as greater than or about 30 rpm, such as greater than or about 40 rpm, such as greater than or about 50 rpm, such as greater than or about 60 rpm, such as greater than or about 70 rpm, such as greater than or about 80 rpm, such as greater than or about 90 rpm, such as greater than or about 100 rpm, such as greater than or about 125 rpm, such as greater than or about 150 rpm, such as greater than or about 175 rpm, such as greater than or about 200 rpm, such as greater than or about 250 rpm, such as greater than or about 300 rpm, such as greater than or about 400 rpm, such as greater than or about 500 rpm, such as less than or about 1500 rpm, such as less than or about 1250 rpm, such as less than or about 1000 rpm, such as less than or about 900 rpm, such as less than or about 800 rpm, such as less than or about 700 rpm, such as less than or about 600 rpm, such as less than or about 650 rpm, such as less than or about 500 rpm, such as less than or about 400 rpm, such as less than or about 300 rpm, or any ranges or values therebetween. However, in embodiments, the system head 310 may rotate according to any one or more of the above speeds, and the spray head 322 may be stationary.

In addition, the speed, pressure, and location and number of spray nozzles 336 may be selected so as to provide approximately even distribution of spray on a time average basis and/or based upon an average amount sprayed on the substrate. Thus, during a process cycle, each location on a substrate 306 may be contacted with an aqueous solution for a period of time that varies from an average spray contact time of less than or about 20%, such less than or about 15%, such as less than or about 10%, such as less than or about 5% of an average spray time, or any ranges or values therebetween.

Nonetheless, in embodiments, each point on a substrate may be contacted with a sprayed aqueous solution for a time period less than or about 3 minutes, such as less than or about 90 seconds, such as less than or about 1 minute, such as less than or about 55 seconds, such as less than or about 50 seconds, such as less than or about 45 seconds, such as less than or about 40 seconds, such as less than or about 35 seconds, such as less than or about 30 seconds, such as less than or about 20 seconds, such as less than or about 10 seconds, or such as greater than or about 5 seconds, such as greater than or about 7 seconds, such as greater than or about 9 seconds, such as greater than or about 10 seconds, such as greater than or about 15 seconds, such as greater than or about 20 seconds, such as greater than or about 25 seconds, such as greater than or about 30 seconds, such as greater than or about 40 seconds, or any ranges or values therebetween.

The wetting agent may include any number of fluids or combinations of fluids, such as aqueous solutions and/or water. In some embodiments the wetting agent may be or include deionized water, including degassed deionized water. Namely, in embodiments, the wetting agent may also be modified in one or more ways to improve absorption of gas from air or any other gas within the chamber environment and that may be trapped within features of the substrate. For instance, in embodiments, the wetting agent may be degassed, such as degassed deionized water. The deionized water may be flowed through a contactor, such as a membrane contactor, prior to being delivered to the processing chamber to remove oxygen or other gas species, such as carbon dioxide. The wetting agent may be degassed to less than or about 50 ppm in embodiments, and may be degassed to less than or about 40 ppm, less than or about 30 ppm, less than or about 20 ppm, less than or about 15 ppm, less than or about 10 ppm, less than or about 9 ppm, less than or about 8 ppm, less than or about 7 ppm, less than or about 6 ppm, less than or about 5 ppm, less than or about 4 ppm, less than or about 3 ppm, less than or about 2 ppm, less than or about 1 ppm, or less. By degassing the wetting agent to reduced levels of ambient gases as well as environmental gases of the chamber, such as carbon dioxide, improved absorption characteristics may be afforded by the present technology. However, as discussed above, in embodiments, degassing may not be necessary when utilizing a displaced atmosphere and spray nozzles according to the technology of the present disclosure.

The methods and systems discussed herein may remove greater than or about 50% of any residual gas within vias or other features defined in the substrate. In some embodiments, the methods may remove residual air, carbon dioxide, or other gas, and may remove greater than or about 60% of residual gas, greater than or about 70% of residual gas, greater than or about 80% of residual gas, greater than or about 90% of residual gas, greater than or about 91% of residual gas, greater than or about 92% of residual gas, greater than or about 93% of residual gas, greater than or about 94% of residual gas, greater than or about 95% of residual gas, greater than or about 96% of residual gas, greater than or about 97% of residual gas, greater than or about 98% of residual gas, greater than or about 99% of residual gas, greater than or about 99.9% of residual gas, greater than or about 99.99% of residual gas, greater than or about 99.999% of residual gas, or may substantially, essentially, or completely remove any residual gas from the features defined on the substrate, even when such features may have a relatively high aspect ratio, such as an aspect ratio of greater than two. The residual gas may be removed via displacement including absorption by the wetting agent in embodiments.

The present technology may reduce the number of vias or features in which gas may remain and/or in which residues remain after the wetting operation, which may be in the form of a bubble defect or residue defect either in the wetting agent or in subsequent operations. For example, subsequent plating operations may form a void or bubble defect at a location in which residual gas or residues were not displaced or absorbed by the wetting agent. The present technology may reduce the number of vias or features including a defect, such as a bubble defect or a residue defect, to less than or about 5% of the vias on the substrate. In some embodiments, the present technology may reduce the number of defects remaining after the wetting operation to less than or about 1% of the vias on the substrate, and may reduce the number of defects to less than or about 0.1%, less than or about 0.01%, less than or about 0.001%, less than or about 0.0001%, less than or about 0.00001%, less than or about 0.000001% of the vias or features on the substrate, or less in embodiments. In some embodiments the present technology may remove all defects after the wetting operation such that no via or feature includes a bubble or residue defect after the wetting or during subsequent plating.

Nonetheless, after spraying operation 210, the system head 310 and/or head assembly 302 may be transitioned back into a transfer position at operation 212, which may be the same vertical position discussed in regards to FIG. 3 or a different position where the system head 310 and/or head assembly 302 are disposed above an upper surface 332 of basin 326. Namely, such an orientation may facilitate removal of the substrate 306 from wetting apparatus 300 and/or transfer of the substrate 306, alone or in combination with seal assembly 338, to a further processing chamber. If vacuum was utilized, vacuum may be broken prior to operation 212, and any wetting agent may be drained through drain manifold 324 after operation 210, but prior to, during, or after operation 212

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMs, EEPROMs, magnetic or optical cards, flash memory, or other types of 10 machine-readable mediums suitable for storing electronic instructions. Alternatively, the methods may be performed by a combination of hardware and software.

What is claimed is:

1. A method of wetting a substrate, the method comprising:
    forming an atmosphere in a basin housing the substrate with a gas, wherein the substrate defines a plurality of features and is coupled with a system head, wherein a head seal is releasably coupled with an upper surface of the basin in a processing position, forming a seal between the basin and a head assembly, wherein the basin comprises a bottom surface and one or more sidewalls;
    spraying a wetting agent comprising water or an aqueous solution with a spray head onto the substrate while maintaining the atmosphere, wherein the spray head is positioned below the substrate;
    rotationally translating the system head and the substrate while maintaining the spraying and the atmosphere; and
    wetting the plurality of features defined in the substrate;
    wherein a distance between the bottom surface of the basin housing and the spray head is less than a height of the one or more sidewalls and the distance maintains the spray head above a height of the aqueous solution or water during the wetting of the substrate.

2. The method of wetting a substrate of claim 1, wherein the substrate is rotationally translated at a speed of about 50 rpm to about 500 rpm.

3. The method of wetting a substrate of claim 1, wherein the spraying occurs at a pressure of about 20 psi to about 100 psi.

4. The method of wetting a substrate of claim 1, wherein the spraying distributes approximately an even amount of the wetting agent at two or more locations on the substrate based upon an average amount of wetting agent sprayed on the substrate.

5. The method of wetting a substrate of claim 1, wherein the spray head comprises one or more spray nozzles, wherein the one or more spray nozzles are spaced apart from the substrate at a height of about 1 mm to about 100 mm.

6. The method of wetting a substrate of claim 1, wherein the atmosphere is a carbon dioxide atmosphere, an atmospheric gas atmosphere, a nitrogen atmosphere, or a combination thereof, formed by a continuous purge, a pump down and backfill, and/or a replacement operation.

7. The method of wetting a substrate of claim 1, wherein the substrate defines at least 1,000 features, and wherein less than 5% of the features contain a bubble defect in the wetting agent.

8. The method of wetting a substrate of claim 1, wherein the wetting agent comprises degassed deionized water or a degassed aqueous solution.

9. The method of wetting a substrate of claim 1, further comprising decreasing a chamber pressure below about 100 kPa during the spraying.

10. The method of wetting a substrate of claim 1, wherein the spraying occurs for about 5 seconds to about 90 seconds.

11. A method of wetting a substrate, the method comprising:
    providing the substrate to a basin housing, wherein the substrate defines a plurality of features and is coupled with a system head, and
        wherein the basin housing comprises a bottom surface and one or more sidewalls;
    displacing air from the plurality of features defined in the substrate with a gas;
    spraying a wetting agent comprising water or an aqueous solution onto the substrate with a spray head, wherein the spray head is positioned below the substrate;

rotationally translating the system head and the substrate while maintaining the spraying; and wetting the plurality of features defined on the substrate, and wherein a distance between the bottom surface of the basin housing and the spray head is less than a height of the one or more sidewalls and the distance maintains the spray head above a height of the aqueous solution or water during the wetting of the substrate.

12. The method of claim 11, wherein the gas comprises carbon dioxide, carbon monoxide, oxygen, nitrogen, atmospheric gas, argon, ammonia, bromine, diazene, acetylene, krypton, xenon, radon, nitrous oxide, hydrogen selenide, one or more hydrocarbons, or a combination thereof.

13. The method of wetting a substrate of claim 11, wherein the wetting agent comprises degassed deionized water or a degassed aqueous solution.

14. The method of wetting a substrate of claim 11, wherein the semiconductor substrate is rotationally translated at a speed of about 100 rpm to about 300 rpm.

15. The method of claim 11, wherein the spraying occurs at a pressure of about 30 psi to about 50 psi.

16. The method of claim 11, wherein the spray head comprises one or more spray nozzles, wherein the one or more spray nozzles are spaced apart from the semiconductor substrate at a height of about 1 mm to about 75 mm.

* * * * *